(12) United States Patent
Kita et al.

(10) Patent No.: US 12,061,417 B2
(45) Date of Patent: Aug. 13, 2024

(54) WATER-DEVELOPABLE PHOTOSENSITIVE RESIN PRINTING ORIGINAL PLATE

(71) Applicant: TOYOBO CO., LTD., Osaka (JP)

(72) Inventors: Toshiyuki Kita, Okayama (JP); Toru Wada, Okayama (JP)

(73) Assignee: TOYOBO MC CORPORATION, Osaka (JP)

( * ) Notice: Subject to any disclaimer, the term of this patent is extended or adjusted under 35 U.S.C. 154(b) by 596 days.

(21) Appl. No.: 17/428,449

(22) PCT Filed: Jan. 21, 2020

(86) PCT No.: PCT/JP2020/001834
§ 371 (c)(1),
(2) Date: Aug. 4, 2021

(87) PCT Pub. No.: WO2020/170691
PCT Pub. Date: Aug. 27, 2020

(65) Prior Publication Data
US 2022/0107563 A1    Apr. 7, 2022

(30) Foreign Application Priority Data

Feb. 21, 2019   (JP) .................................. 2019-029628

(51) Int. Cl.
| | | |
|---|---|---|
| G03F 7/038 | (2006.01) | |
| B41C 1/10 | (2006.01) | |
| B41N 1/12 | (2006.01) | |
| G03F 7/09 | (2006.01) | |
| G03F 7/11 | (2006.01) | |
| G03F 7/32 | (2006.01) | |

(52) U.S. Cl.
CPC .......... *G03F 7/0382* (2013.01); *B41C 1/1016* (2013.01); *B41N 1/12* (2013.01); *G03F 7/11* (2013.01); *G03F 7/322* (2013.01); *B41C 2201/02* (2013.01)

(58) Field of Classification Search
CPC ....................................................... B41N 1/12
See application file for complete search history.

(56) References Cited

FOREIGN PATENT DOCUMENTS

| | | |
|---|---|---|
| JP | 10-293395 A | 11/1998 |
| JP | 2007-533510 A | 11/2007 |
| JP | 2008-518267 A | 5/2008 |
| JP | 2013-117741 A | 6/2013 |
| JP | 2013-178428 A | 9/2013 |
| JP | 2015-176066 A | 10/2015 |
| JP | 2016-173454 A | 9/2016 |
| JP | 2016-188900 A | 11/2016 |
| JP | 2019-101337 A | 6/2019 |
| WO | 2005/108077 A2 | 11/2005 |
| WO | 2006/049666 A2 | 5/2006 |
| WO | 2014/034213 A1 | 3/2014 |

OTHER PUBLICATIONS

Notification of Transmittal of Translation of the International Preliminary Report on Patentability (Form PCT/IB/338) issued in counterpart International Application No. PCT/JP2020/001834 mailed Sep. 2, 2021, with Forms PCT/IB/373 and PCT/ISA/237. (5 pages).
International Search Report dated Mar. 24, 2020, issued in counterpart International Application No. PCT/JP2020/001834. (2 pages).
Supplementary European Search Report dated Nov. 21, 2022, issued in counterpart EP Application No. 20758929.2. (8 pages).

*Primary Examiner* — John S Chu
(74) *Attorney, Agent, or Firm* — WHDA, LLP

(57) ABSTRACT

A photosensitive resin printing original plate is disclosed in which a side surface light-blocking layer does not peel off from a metal support during handling of the printing original plate, and which enables efficient production of the side surface light-blocking layer. A water-developable photosensitive resin printing original plate, includes at least: a support; and a photosensitive resin layer arranged on the support, in which a peripheral side surface of the water-developable photosensitive resin printing original plate is covered with a light-blocking layer; the light-blocking layer contains carbon black and a vinyl polymer at a mass ratio of 80/20 to 30/70; and the vinyl polymer is an alcohol-soluble vinyl polymer containing 25 to 65 mol % of a hydroxyl group with respect to a constituent monomer unit in a molecule (in the case of being chemically modified, a constituent monomer unit after the modification).

8 Claims, No Drawings

WATER-DEVELOPABLE PHOTOSENSITIVE RESIN PRINTING ORIGINAL PLATE

TECHNICAL FIELD

The present invention relates to a water-developable photosensitive resin printing original plate capable of efficiently using the entire surface of a printing plate without the need to cut off a frame portion around the printing plate after producing the printing plate.

BACKGROUND ART

As to a water-developable photosensitive resin printing original plate, a relief printing original plate and a flexographic printing original plate that is one type of the relief printing original plate are generally known (Patent Documents 1 and 2). The relief printing original plate is a plate mainly used for printing of business forms and the like. On the other hand, the flexographic printing original plate is a plate mainly used for printing of films, labels, cardboards and the like, and has a feature that the hardness of the plate is lower and softer than that of the relief printing original plate. Both the relief printing original plate and the flexographic printing original plate basically have a layer configuration in which a photosensitive layer containing a photosensitive resin composition is arranged on a support layer such as a polyethylene terephthalate film. These printing original plates are imagewise exposed and then developed to produce a printing plate. Specifically, in the imagewise exposure step, a negative film is brought into close contact with the photosensitive layer, and the printing original plate is irradiated with an active ray through the negative film, and the irradiated portion of the photosensitive layer is cured. Next, in the development step, the printing original plate is washed with an aqueous developer, whereby an uncured portion of the photosensitive layer is removed to form a relief.

On the other hand, in recent years, as to a modified example of the relief printing original plate and the flexographic printing original plate, there is also generally used a printing original plate to which a computer plate making technique (Computer to Plate, CTP technique) is applied (CTP relief printing original plate or CTP flexographic printing original plate). Each of these CTP (computer to plate) printing original plates is different from the conventional relief printing original plate and flexographic printing original plate in that a heat-sensitive mask layer is further arranged on the photosensitive layer in the basic layer configuration (layer configuration in which a photosensitive layer containing a photosensitive resin composition is arranged on a support layer such as a polyethylene terephthalate film) of the conventional relief printing original plate and flexographic printing original plate. Further, in any of these CTP printing original plates, similarly to the conventional relief printing original plate and flexographic printing original plate, a printing plate is produced by the imagewise exposure and subsequent development. However, the imagewise exposure step is different from that of the conventional relief printing original plate and flexographic printing original plate. That is, in the imagewise exposure step, instead of using the negative film, the heat-sensitive mask layer is irradiated with an infrared laser according to information processed on a computer, and the heat-sensitive mask layer of the irradiated portion is evaporated to form an image pattern having a function corresponding to the negative film on the photosensitive layer. Thereafter, the printing original plate is irradiated with an active ray, so that the irradiated portion of the photosensitive layer is cured. Next, in the development step, similarly to the conventional relief printing original plate and flexographic printing original plate, the printing original plate is washed with an aqueous developer, whereby an uncured portion of the photosensitive layer is removed to form a relief.

In these photosensitive resin printing original plates, a printing plate is produced by forming an image pattern on a photosensitive layer via a negative film or a heat-sensitive mask layer, but conventionally, a side surface portion of the printing original plate is not shielded from light at all. Therefore, the photosensitive resin in the photosensitive layer on the side surface portion of the printing original plate is photocured by an active ray with which the printing original plate is irradiated during the exposure step. As a result, the periphery of the printing plate obtained after the development step becomes a development residue (frame portion) in a frame shape. Therefore, conventionally, the printing plate is attached to the printing machine after the frame portion is cut off so that the frame portion does not affect the print pattern.

However, the work of cutting off the frame portion from the printing plate is a complicated work. In addition, there is a problem that the printing area of the entire printing plate is reduced by the amount of cutting off. Further, there is also a problem that the material is wasted because the cut portion cannot be reused and is discarded.

In order to solve these problems, Patent Document 3 proposes that a coating material containing an ultraviolet-absorbing material such as carbon black and a water-soluble film-forming polymer such as a partially saponified polyvinyl alcohol containing a hydroxyl group at a high concentration in the molecule is applied to a side surface portion of a printing original plate and dried to form a light-blocking layer, thereby preventing photocuring of a photosensitive resin in a photosensitive layer in the side surface portion of the printing original plate.

However, when a printing original plate having a light-blocking layer formed on a side surface thereof as in Patent Document 3 is used as, for example, a CTP printing original plate, the side surface light-blocking layer may peel off from the support during handling in the production process of the printing plate. Therefore, photocuring of the photosensitive resin in the photosensitive layer on the side surface portion of the printing original plate may not be sufficiently prevented. This problem is particularly remarkable when a metal support that has been recently demanded is used as the support. In addition, the side surface light-blocking layer adopted in Patent Document 3 has a problem that it takes time to dry the coating material after being applied on the side surface portion of the printing original plate, and thus the production efficiency is poor.

PRIOR ART DOCUMENTS

Patent Documents

Patent Document 1: Japanese Patent Application Laid-Open (JP-A) No. 2013-117741
Patent Document 2: WO 2014/034213
Patent Document 3: Japanese Patent Application Laid-Open (JP-A) No. 2016-173454

DISCLOSURE OF THE INVENTION

Problem that the Invention is to Solve

The present invention has been made in view of the current state of the conventional art, and an object thereof is to provide a photosensitive resin printing original plate in which a side surface light-blocking layer does not peel off from a support during handling of the printing original plate, and which enables efficient production of the side surface light-blocking layer.

Means for Solving the Problem

As a result of intensive studies to achieve the above object, the present inventors have found that, in covering the side surface portion of the printing original plate with the light-blocking layer, by using, as a dispersion binder used for uniformly dispersing carbon black (which is a light-blocking component in the light-blocking layer) in a solvent, a vinyl polymer containing a hydroxyl group at a moderate concentration in the molecule, instead of a water-soluble polymer containing a hydroxyl group at a high concentration in the molecule as in Patent Document 3, the hardness of the side surface light-blocking layer to be formed can be reduced, whereby followability of the side surface light-blocking layer to the support can be improved. As a result, peeling of the side surface light-blocking layer from the support can be effectively prevented. In addition, the present inventors found that by changing the solubility of the dispersion binder from water-soluble to alcohol-soluble, not only water but also alcohol can be used as a solvent in preparing the coating material. As a result, the time required for drying the coating material after application can be shortened.

That is, the present invention has been completed based on the above findings, and has the following configurations (1) to (8).

(1) A water-developable photosensitive resin printing original plate, comprising at least: a support; and a photosensitive resin layer arranged on the support, in which a peripheral side surface of the water-developable photosensitive resin printing original plate is covered with a light-blocking layer; the light-blocking layer contains carbon black and a vinyl polymer at a mass ratio of 80/20 to 30/70; and the vinyl polymer is an alcohol-soluble vinyl polymer containing 25 to 65 mol % of a hydroxyl group with respect to a constituent monomer unit in a molecule (in the case of being chemically modified, a constituent monomer unit after the modification).

(2) The water-developable photosensitive resin printing original plate according to (1), in which the vinyl polymer is a polyvinyl acetal resin.

(3) The water-developable photosensitive resin printing original plate according to (1), in which the vinyl polymer is a partially saponified vinyl acetate resin having a saponification ratio of 25 to 65 mol %.

(4) The water-developable photosensitive resin printing original plate according to any of (1) to (3), in which the light-blocking layer further contains a water-soluble or water-dispersible polyamide resin in an amount of 5 to 40 mass %.

(5) The water-developable photosensitive resin printing original plate according to (4), in which the water-soluble or water-dispersible polyamide resin is selected from the group consisting of a tertiary nitrogen atom-containing polyamide, an ammonium salt type tertiary nitrogen atom-containing polyamide, an ether group-containing polyamide, and a sulfonic group-containing polyamide.

(6) The water-developable photosensitive resin printing original plate according to any of (1) to (5), in which the support is a metal support.

(7) The water-developable photosensitive resin printing original plate according to any of (1) to (6), in which the water-developable photosensitive resin printing original plate is a CTP relief printing original plate or a CTP flexographic printing original plate.

(8) A method for producing a printing plate, comprising the steps of: imagewise exposing the water-developable photosensitive resin printing original plate according to any of (1) to (7); and developing the water-developable photosensitive resin printing original plate after the exposure with an aqueous developer, in which in the step of developing the water-developable photosensitive resin printing original plate after the exposure with the aqueous developer, an uncured portion of the photosensitive layer of the water-developable photosensitive resin printing original plate and the light-blocking layer on a peripheral side surface of the water-developable photosensitive resin printing original plate are each washed away with the aqueous developer and removed from the water-developable photosensitive resin printing original plate.

Advantages of the Invention

In the water-developable photosensitive resin printing original plate of the present invention, an alcohol-soluble vinyl polymer containing a hydroxyl group at a moderate concentration in the molecule is used as a dispersion binder for carbon black which is a light-blocking component in the side surface light-blocking layer covering the peripheral side surface of the printing original plate. Accordingly, followability of the side surface light-blocking layer to the support can be enhanced. As a result, peeling of the side surface light-blocking layer from the support can be effectively prevented. In addition, in the water-developable photosensitive resin printing original plate of the present invention, a specific alcohol-soluble vinyl polymer is used in a specific amount for the light-blocking layer. Accordingly, an alcohol solvent can be used at the time of preparing the coating material which constitutes the light-blocking layer. As a result, the drying time can be shortened, and the time required for producing the side surface light-blocking layer can be greatly shortened.

BEST MODE FOR CARRYING OUT THE INVENTION

Hereinafter, the water-developable photosensitive resin printing original plate of the present invention will be described in detail.

As to the water-developable photosensitive resin printing original plate which is an object of the present invention, any conventionally known photosensitive resin printing original plate can be adopted as long as it can be developed with an aqueous developer. For example, the photosensitive resin printing original plate can be a relief printing original plate, a flexographic printing original plate, a CTP relief printing original plate, or a CTP flexographic printing original plate as described above.

The water-developable photosensitive resin printing original plate of the present invention has the same configuration as a conventionally known water-developable photosensitive resin printing original plate except that the peripheral side surface of the printing original plate is covered with a light-blocking layer. Thus, the water-developable photosensitive resin printing original plate of the present invention comprises at least: a support and a photosensitive resin layer arranged on the support. As to the support and the photosensitive resin layer, conventionally known ones can be used, and therefore will not be described in detail here. Regarding the support, a metal support such as steel or aluminum, a plastic resin support such as a polyester film, or the like can be used. Among them, a metal support is preferable from the viewpoint of pressure resistance. According to the present invention, it is possible to provide a photosensitive resin printing original plate in which the light-blocking layer on the side surface thereof does not peel off from the support during handling of the printing original plate, particularly even when a metal support having poor adhesion to a resin is used.

In the printing original plate of the present invention, the peripheral side surface of the printing original plate is covered with a light-blocking layer containing carbon black and a vinyl polymer.

In the present invention, the "peripheral side surface of the printing original plate" means a side surface in the thickness direction of the printing original plate present on four corner sides of the laminated surface of each layer (support layer, photosensitive layer, etc.) constituting the printing original plate.

The carbon black in the light-blocking layer has a role of blocking the transmission of the active ray with which the printing original plate is irradiated in the exposure step of the printing original plate. On the other hand, the vinyl polymer is a film-formable polymer, and has a role as a dispersion binder for uniformly dispersing carbon black in a solvent. The vinyl polymer also has a role of dissolving or dispersing the light-blocking layer in an aqueous developer so that the light-blocking layer is easily washed away from the printing original plate at the time of washing the printing original plate with the aqueous developer in the development step of the printing original plate.

In the light-blocking layer of the present invention, by combining carbon black and a vinyl polymer, carbon black can be uniformly dispersed at a high concentration on the peripheral side surface of the printing original plate to form a film, so that the light-blocking effect by carbon black can be enhanced.

The mass ratio of the carbon black and the vinyl polymer in the light-blocking layer needs to be 80/20 to 30/70. It is preferably 75/25 to 35/65 and further preferably 70/30 to 40/60. When the mass ratio of the carbon black and the vinyl polymer in the light-blocking layer is less than the above lower limit, the amount of the carbon black may be too small, the light-blocking effect may not be sufficient, and thus formation of an unnecessary frame portion may not be sufficiently prevented. On the other hand, when the mass ratio of the carbon black and the vinyl polymer in the light-blocking layer exceeds the above upper limit, the amount of the vinyl polymer may be too small, the light-blocking layer may not be sufficiently washed away from the printing original plate during the development step, and thus the light-blocking layer may remain on the obtained printing plate. The total amount of the carbon black and the vinyl polymer in the light-blocking layer is preferably 50 wt. % or more, more preferably 60 wt. % or more, and further preferably 70 wt. % or more.

The vinyl polymer used in the present invention is a hydroxyl group-containing vinyl polymer containing a hydroxyl group in the molecule. Here, the hydroxyl group concentration in the molecule means the percentage of the constituent monomer unit having a hydroxyl group with respect to the total number of moles of the constituent monomer unit in the vinyl polymer. Therefore, when the amount of the constituent monomer unit having a hydroxyl group in the polymer is 50 mol %, the hydroxyl group content is 50 mol %. When a chemically modified resin such as a polyvinyl butyral resin is used as a vinyl polymer, the total number of moles of the constituent monomer unit in the vinyl polymer is calculated based on the constituent monomer unit after the chemical modification.

The hydroxyl group concentration in the vinyl polymer used in the present invention needs to be 25 to 65 mol %. It is preferably 28 to 60 mol % and further preferably 33 to 55 mol %. When the hydroxyl group concentration in the vinyl polymer exceeds the above upper limit, not only the side surface light-blocking layer may peel off from the support, but also it may take time to dry the coating material in the production of the side surface light-blocking layer, and the production efficiency may be poor.

The hydroxyl group concentration (25 to 65 mol %) in the vinyl polymer used in the present invention is set to be lower than the hydroxyl group concentration (70 to 90 mol %) in the water-soluble film-forming polymer used in Patent Document 3 described above. When a polymer having a hydroxyl group at a high concentration in the molecule, such as the water-soluble film-forming polymer used in Patent Document 3 is used as a dispersion binder for carbon black, the hardness of the side surface light-blocking layer to be formed is increased. Thus, the side surface light-blocking layer cannot sufficiently follow the support, causing a problem that the side surface light-blocking layer peels off from the support during handling of the printing original plate. On the other hand, in the present invention, the hydroxyl group concentration in the vinyl polymer used as the dispersion binder for carbon black is lowered to a moderate level. Accordingly, a side surface light-blocking layer having not so high hardness can be formed, and thus the above-described problem does not occur. The side surface light-blocking layer of the present invention is more flexible than the conventional side surface light-blocking layer, and thus can closely adhere to the support and follow the support well. Therefore, there is no peeling of the side surface light-blocking layer from the support during handling of the printing original plate.

In the present invention, by lowering the hydroxyl group concentration in the vinyl polymer to be used, the solubility of the vinyl polymer can be made not water-soluble but alcohol-soluble. When an alcohol-soluble dispersion binder is used, not only water but also alcohol can be used as a solvent at the time of preparing the coating material which constitutes the side surface light-blocking layer. Therefore, the solvent can be evaporated at an early stage, so that the drying time of the coating material can be shortened.

However, when the hydroxyl group concentration in the vinyl polymer is excessively reduced, water developability may be deteriorated. That is, when the hydroxyl group concentration in the vinyl polymer is less than the lower limit, the light-blocking layer is hardly dissolved or dispersed in the aqueous developer at the time of washing the printing original plate with the aqueous developer in the development step of the printing original plate, and thus there is a possibility that it becomes difficult to wash off the light-blocking layer from the printing original plate.

The term "water-soluble" in the present invention means having an ability to be dissolved or dispersed in water, and means that, for example, when a polymer (resin) formed into a film shape is immersed in water at room temperature to 40° C. and rubbed with a brush or the like, the polymer is entirely eluted or partially eluted, or swollen, separated, and dispersed in water, so that the film is reduced in weight or disintegrated.

In addition, the term "alcohol-soluble" in the present invention means having an ability to be dissolved in alcohol, and means that, for example, when 10 g of a polymer (resin) formed into a film shape and 90 g of alcohol are weighed into a 200 ml three-necked flask, stirred at 70° C. for 2 hours while being refluxed with a cooling tube, cooled, and then visually evaluated, the polymer is almost completely dissolved. The alcohol used here is an alcohol having 1 to 4 carbon atoms, and is specifically methanol, ethanol, isopropyl alcohol, or the like.

Examples of the hydroxyl group-containing vinyl polymer used in the present invention include: a partially saponified vinyl acetate polymer obtained by a method of saponifying an acylated vinyl polymer having an acyl group such as an acetyl group or a propanoyl group; and a hydroxyl group-containing vinyl polymer obtained by introducing a constituent unit having a hydroxyl group by a method of copolymerizing a monomer having a hydroxyl group in the molecule. Further, a polyvinyl acetal resin having a hydroxyl group and an acetal structure can be exemplified, which is obtained by acetalizing a part of the hydroxyl group in the obtained hydroxyl group-containing vinyl polymer with formaldehyde or butyraldehyde under acidic conditions.

Among these polymers, first, a partially saponified vinyl acetate polymer will be described. The saponification ratio of the partially saponified vinyl acetate polymer is preferably 25 to 65 mol %, further preferably 28 to 60 mol %, and especially preferably 33 to 55 mol %. In the case of the partially saponified vinyl acetate, the number of moles of saponified vinyl acetate corresponds to the hydroxyl group content. Accordingly, the saponification ratio (mol %) indicates the hydroxyl group content (mol %). When the saponification ratio of the partially saponified vinyl acetate polymer is less than the above lower limit, water developability may be insufficient. On the other hand, when the saponification ratio exceeds the upper limit, not only the side surface light-blocking layer peels off from the support, but also it takes time to dry the coating material in the production of the side surface light-blocking layer, and the production efficiency may be poor. In addition, dispersibility of carbon black may be deteriorated. The acylated vinyl polymer which is used as a raw material of the partially saponified vinyl acetate polymer may be a copolymer, for example, an ethylene-vinyl acetate copolymer obtained by copolymerizing ethylene. Even in such copolymer, a hydroxyl group can be introduced thereto by saponification in the same manner.

Next, a vinyl polymer having a hydroxyl group in the molecule, which is obtained by introducing a constituent unit having a hydroxyl group by a method of copolymerizing a monomer having a hydroxyl group in the molecule, will be described. This vinyl polymer is a copolymer of a vinyl monomer containing a hydroxyl group in the molecule and a vinyl monomer containing no hydroxyl group in the molecule. Examples of the vinyl monomer having a hydroxyl group in the molecule include 2-hydroxyethyl (meth)acrylate and 2-hydroxypropyl (meth)acrylate. As to the vinyl monomer containing no hydroxyl group, a commercially available monomer can be used. Examples thereof include: methacrylic acid esters such as methyl methacrylate and ethyl methacrylate; benzyl (meth)acrylate, cyclohexyl (meth)acrylate, phenoxymethyl (meth)acrylate, and tetrahydrofurfuryl (meth)acrylate. The ratio of the vinyl monomer containing a hydroxyl group in the molecule is preferably 25 to 40 mol % from the viewpoint of both of developability and moisture-absorption property. Specific examples thereof include a copolymer of methyl methacrylate and hydroxypropyl methacrylate and a copolymer of ethyl methacrylate and tetrahydrofurfuryl acrylate.

Next, the polyvinyl acetal resin will be described. As to the polyvinyl acetal resin, a polyvinyl butyral resin is preferable from the viewpoint of ease of synthesis. The polyvinyl butyral resin is obtained by reacting polyvinyl alcohol with n-butylaldehyde, and has a butyral group and a hydroxyl group. The degree of saponification of polyvinyl alcohol used as a raw material is preferably 95% or more and further preferably 98% or more. The degree of polymerization of polyvinyl alcohol is preferably 200 to 2,000 from the viewpoint of both the coatability and physical properties of the light-blocking layer. In the case of the polyvinyl butyral resin, the hydroxyl group content is preferably 50 mol % or less and further preferably 40 mol % or less. When the polyvinyl butyral resin having a hydroxyl group content exceeding the above-described upper limit is used, the light-blocking layer may be softened and easily damaged because the moisture absorption amount increases. The acetyl group may remain as long as it does not affect the performance.

Among the examples described above, the hydroxyl group-containing vinyl polymer used in the present invention is preferably a partially saponified vinyl acetate having a saponification ratio of 25 to 65 mol % and a polyvinyl acetal resin. Especially preferable one is a polyvinyl acetal resin. The polyvinyl acetal resin has excellent flexibility and toughness, and thus is optimal for a film used for a side surface light-blocking layer of a CTP plate. Furthermore, the polyvinyl acetal resin is excellent in adhesion to metal, and thus is also optimal for dealing with a CTP plate having a metal support which has been recently demanded. Among polyvinyl acetal resins, a polybutyral resin acetalized with butylaldehyde is particularly optimal because it is excellent in physical properties and adhesion to metals, and can also impart water developability to the light-blocking layer.

In the printing original plate of the present invention, the side surface light-blocking layer may contain a water-soluble or water-dispersible polyamide resin in addition to the carbon black and the hydroxyl group-containing vinyl polymer. By blending the water-soluble or water-dispersible polyamide resin, the hydrophilicity of the light-blocking layer is further improved, and thus the light-blocking layer can be stably removed in the water development step. Examples of the water-soluble or water-dispersible polyamide resin include a tertiary nitrogen atom-containing polyamide, an ammonium salt type tertiary nitrogen atom-containing polyamide, an ether group-containing polyamide, and a sulfonic group-containing polyamide. Among them, the tertiary nitrogen atom-containing polyamide resin is especially preferred in terms of water-solubility. The tertiary nitrogen atom-containing polyamide resin is a polyamide resin containing a tertiary nitrogen atom (a nitrogen atom constituting an amino group that is not an amide group) in a part of the main chain or the side chain. Among them, a polyamide resin containing a tertiary nitrogen atom in the main chain is preferable. Specific examples of the tertiary nitrogen atom-containing polyamide resin include a polyamide obtained by copolymerizing, as a diamine component, a diamine containing a tertiary nitrogen atom such as a diamine having a piperazine ring or methyliminobispropylamine. Among them, the polyamide obtained by copolymerizing a diamine having a piperazine ring is especially preferred. Examples of the diamine having a piperazine ring include 1,4-bis(3-aminoethyl)piperazine, 1,4-bis(3-aminopropyl)piperazine, and N-(2-aminoethyl)piperazine. From the viewpoint of physical properties, the water-soluble polyamide resin can also be a copolymerized polyamide resin obtained by partially using a raw material such as a diamine containing no tertiary nitrogen atom, a dicarboxylic acid, or an aminocarboxylic acid, in addition to the above-mentioned raw material containing a tertiary nitrogen atom.

The addition amount of the water-soluble or water-dispersible polyamide resin is preferably in a range of 5 to 40 mass % in the entire light-blocking layer composition. When the content is less than the above lower limit, the effect of improving the water developability may be poor, whereas when the content is more than the above upper limit, adhesion to the metal support may be deteriorated.

In the printing original plate of the present invention, the side surface light-blocking layer may further contain a methoxymethylated polyamide resin in addition to the water-soluble or water-dispersible polyamide resin. By blending the methoxymethylated polyamide resin, the problem that the side surface light-blocking layer becomes brittle at low temperature can be improved.

In the printing original plate of the present invention, in order to further improve the dispersibility of the carbon black, the side surface light-blocking layer may contain a dispersant other than the hydroxyl group-containing vinyl polymer as long as the performance is not adversely affected. As to such dispersant, for example, polyvinyl alcohol, modified polyvinyl alcohol, an anionic polymer, or the like can be used.

As to the method for producing a water-developable photosensitive resin printing original plate of the present invention, a conventionally known method can be adopted as it is, except for the step of covering the peripheral side surface of the printing original plate with a light-blocking layer. A method for forming the coating of the light-blocking layer is also not particularly limited, and an example of the method will be described below.

First, components (that is, a hydroxyl group-containing vinyl polymer or a water-soluble or water-dispersible polyamide resin) other than carbon black of the light-blocking layer are dissolved in a solvent, and carbon black is dispersed therein to prepare a dispersion of carbon black. As to the solvent used for preparing the dispersion, water, an alcohol such as methanol or ethanol, or a mixed solution thereof is preferable, but other solvents may be added as long as the dispersibility of carbon black is not deteriorated. Next, the upper surface and the lower surface of the conventional water-developable photosensitive resin printing original plate are sandwiched between acrylic plates having the same size as the upper surface and the lower surface, so that only the peripheral side surface of the printing original plate is exposed. Then, the exposed peripheral side surface is coated with the dispersion of carbon black by a coating method such as a coater, spray, brush, or dipping, and dried to evaporate the solvent, thereby forming a coating of the light-blocking layer on the peripheral side surface of the printing original plate.

Next, a method for producing a printing plate from the water-developable photosensitive resin printing original plate of the present invention will be explained. This method comprises the steps of: imagewise exposing the water-developable photosensitive resin printing original plate of the present invention; and developing the water-developable photosensitive resin printing original plate after the exposure with an aqueous developer. The present invention is characterized in that, in the development step, an uncured portion of the photosensitive layer of the water-developable photosensitive resin printing original plate and the light-blocking layer on a peripheral side surface of the water-developable photosensitive resin printing original plate are each washed away with the aqueous developer and removed from the water-developable photosensitive resin printing original plate.

Specifically, in the imagewise exposure step, a negative film is not used because the printing original plate is a CTP relief printing original plate or a CTP flexographic printing original plate. Instead, the heat-sensitive mask layer is irradiated with an infrared laser according to information processed on a computer, whereby the heat-sensitive mask layer of the irradiated portion is evaporated to form an image pattern having a function corresponding to the negative film on the photosensitive layer. Thereafter, the printing original plate is irradiated with an active ray, so that the irradiated portion of the photosensitive layer is cured. In the method for producing a printing plate of the present invention, in any case, the peripheral side surface of the printing original plate is covered with the light-blocking layer. Thus, even if the printing original plate is irradiated with an active ray during the exposure step, the photosensitive resin in the photosensitive layer on the side surface portion of the printing original plate is not photocured, and an unnecessary frame portion is not formed on the obtained printing plate. Therefore, it is not necessary to cut off the frame portion around the printing plate after producing the printing plate, and the entire surface of the printing plate can be efficiently used.

Next, in the development step, the printing original plate is washed with an aqueous developer, whereby an uncured portion of the photosensitive layer is removed to form a relief. In the method for producing a printing plate of the present invention, at this time, not only the uncured portion of the photosensitive layer but also the light-blocking layer formed on the peripheral side surface of the printing original plate is washed away with the aqueous developer, and removed from the printing original plate. This is because the hydroxyl group-containing alcohol-soluble vinyl polymer having a hydroxyl group in the molecule, which is contained in the light-blocking layer, is dissolved and dispersed in the aqueous developer, and the light-blocking layer is disintegrated. Therefore, the light-blocking layer does not remain on the printing plate finally produced.

EXAMPLES

As hereunder, the present invention will be more specifically illustrated by referring to Examples although the present invention is not limited to those Examples. A term "part(s)" in Examples (text) stand(s) for part(s) by mass.

Examples 1 to 10 and Comparative Examples 1 to 5

(1) Preparation of Raw Materials to be Used

As to raw materials to be used, the following materials were prepared.
(i) Carbon Black
  A: MICROPIGMO AMBK-8 (Orient Chemical Industries Co., Ltd.)
(ii) Alcohol-Soluble Vinyl Polymer Containing a Hydroxyl Group in the Molecule
  B-1: Alcohol-soluble polyvinyl butyral resin having a hydroxyl group content of about 29 mol % and a butyral group content of 70 mol % on average (BL-2H, manufactured by Sekisui Chemical Company, Limited)
  B-2: Alcohol-soluble polyvinyl butyral resin having a hydroxyl group content of about 34 mol % and a butyral group content of 65 mol % on average (BM-1, manufactured by Sekisui Chemical Company, Limited)

B-3: Alcohol-soluble polyvinyl butyral resin having a hydroxyl group content of about 36 mol % and a butyral group content of 63 mol % on average (BL-2, manufactured by Sekisui Chemical Company, Limited)

B-4: Alcohol-soluble polyvinyl butyral resin having a hydroxyl group content of about 22 mol % and a butyral group content of 74 mol % on average (BL-S, manufactured by Sekisui Chemical Company, Limited) (for Comparative Example)

C-1: Alcohol-soluble partially saponified vinyl acetate having an average degree of saponification (hydroxyl group content) of 48 mol % (LL-810, manufactured by The Nippon Synthetic Chemical Industry Co., Ltd.)

C-2: Alcohol-soluble partially saponified vinyl acetate having an average degree of saponification (hydroxyl group content) of 37 mol % (LL-940, manufactured by The Nippon Synthetic Chemical Industry Co., Ltd.)

(iii) Polyvinyl Alcohol

D1: Polyvinyl alcohol having an average degree of saponification (hydroxyl group content) of 98.5 mol % (NL-05, manufactured by The Nippon Synthetic Chemical Industry Co., Ltd.) (for Comparative Example)

D2: Polyvinyl alcohol having an average degree of saponification (hydroxyl group content) of 88 mol % (GH-05, manufactured by The Nippon Synthetic Chemical Industry Co., Ltd.) (for Comparative Example)

(iv) Water-Soluble Polyamide Resin

E: 520 parts by mass of ε-caprolactam, 430 parts by mass of N,N'-di(γ-aminopropyl)piperazine adipate, 50 parts by mass of 3-bisaminomethylcyclohexane adipate, and 100 parts by mass of water were added in an autoclave, and the autoclave was purged with nitrogen, then sealed, and gradually heated. From the time point when the internal pressure reached 10 kg/m$^3$, water was distilled until the pressure could not be maintained any longer. The pressure was returned to normal pressure in about 2 hours, and then the reaction was carried out at normal pressure for 1 hour. The maximum polymerization reaction temperature was 255° C. This gave a tertiary nitrogen atom-containing polyamide resin having a glass transition point of 40° C. and a specific viscosity of 1.95.

(2) Preparation of Coating Liquid for Side Surface Light-Blocking Layer

According to the composition (mass ratio) described in Table 1, components other than carbon black were dissolved in ethanol. Then, carbon black was dispersed therein to prepare a dispersion liquid, which was then used as a coating liquid. Regarding the two types of polyvinyl alcohol used in Comparative Examples 1 and 2, they had a high degree of saponification (hydroxyl group content) and were not dissolved in alcohol. Accordingly, they were dissolved in isopropyl alcohol containing 70 mass % of water instead of ethanol.

(3) Production of Printing Original Plate Having Side Surface Light-Blocking Layer As to a water-developable photosensitive resin printing original plate, a CTP relief printing original plate (QM95KT, manufactured by Toyobo Co., Ltd.) was provided. In this printing original plate, a steel plate having a thickness of 240 μm was used as a support. A plurality of the original plates were stacked and fixed with cushion layers interposed therebetween. The plate side surface thus formed was coated with the above-described coating liquid, and dried to form a coating film (light-blocking layer) on the plate side surface, thereby obtaining a printing original plate having a side surface light-blocking layer.

(4) Evaluation of Performance

The performance of the printing original plate having the side surface light-blocking layer produced as described above was evaluated as follows. Note that, regarding the light-blocking property, the water developability, and the alcohol solubility, not the printing original plate itself but an evaluation sample was separately prepared, and the performance was evaluated using this evaluation sample.

(i) Light-Blocking Property

A PET film support was coated with a coating liquid using a bar coater appropriately selected so as to produce a film thickness of 1.8 μm, and dried at 96° C. for 3 minutes to prepare an evaluation sample having a light-blocking layer. The optical density of the coated surface of this sample was measured, and the sample was evaluated according to the following criteria using a black-and-white transmission densitometer DM-520 (Dainippon Screen Mfg. Co., Ltd.).

∘∘: Optical density is more than 2.4.
∘: Optical density is within a range of 2.0 to 2.4.
Δ: Optical density is not less than 1.6 and less than 2.0.
x: Optical density is less than 1.6.

(ii) Water Developability

A sample similar to the sample for evaluation of light-blocking property was cut into a 10 cm×10 cm square, immersed in water at room temperature to 40° C., and reciprocatingly abraded 10 times with a nylon brush having a diameter of 120 μm. The surface of the light-blocking layer at that time was observed and evaluated according to the following criteria.

∘∘: A sample whose all surfaces were confirmed to be eluted.
∘: A sample which was confirmed to be partially eluted, or swollen, separated, and dispersed in water.
Δ: A sample which was confirmed to be partially swollen, separated, and dispersed in water without being eluted.
x: A sample which was confirmed to not be entirely or partially eluted, or not be swollen, separated, and dispersed in water.

(iii) Alcohol Solubility

According to the composition (mass ratio) described in Table 1, 10 g of a hydroxyl group-containing vinyl polymer or polyvinyl alcohol and 90 g of ethanol were weighed into a 200 ml three-necked flask, and stirred at 70° C. for 2 hours while being refluxed with a cooling tube. After cooling, the alcohol solubility was visually evaluated.

∘: Almost completely dissolved.
x: A considerable amount of undissolved matter remained.

When the evaluation of the alcohol solubility is "∘", the dispersion binder is alcohol-soluble, and therefore not only water but also alcohol can be used as a solvent at the time of preparing the coating material which constitutes the side surface light-blocking layer. As a result, the time required for drying the coating material after application can be shortened.

(iv) Adhesion to Metal Support

A printing original plate, in which the coating film (light-blocking layer) was applied to the side surface of the plate, was reciprocatingly abraded 10 times with a nylon brush having a diameter of 80 μm, and peeling of the light-blocking layer was evaluated according to the following criteria.

∘: No peeling of coating film.
x: Coating film peeled.

The details of the raw materials and compositions of Examples 1 to 10 and Comparative Examples 1 to 5, and the results of the performance evaluation are shown in Table 1 below.

for carbon black which is a light-blocking component in the side surface light-blocking layer. As a result, peeling of the side surface light-blocking layer from the support including a metal support can be effectively prevented. In addition, the

TABLE 1

| | | | | Example 1 | Example 2 | Example 3 | Example 4 | Example 5 | Example 6 | Example 7 | Example 8 |
|---|---|---|---|---|---|---|---|---|---|---|---|
| Composition of side surface light-blocking layer (mass %) | carbon black | | A | 50 | 40 | 60 | 70 | 50 | 40 | 50 | 50 |
| | hydroxyl group-containing vinyl polymer | butyral resin | B1 | 50 | 60 | 40 | 30 | 40 | 40 | 0 | 0 |
| | | | B2 | 0 | 0 | 0 | 0 | 0 | 0 | 50 | 0 |
| | | | B3 | 0 | 0 | 0 | 0 | 0 | 0 | 0 | 50 |
| | | | B4 | 0 | 0 | 0 | 0 | 0 | 0 | 0 | 0 |
| | | partially saponified vinyl acetate | C1 | 0 | 0 | 0 | 0 | 0 | 0 | 0 | 0 |
| | | | C2 | 0 | 0 | 0 | 0 | 0 | 0 | 0 | 0 |
| | | polyvinyl alcohol | D1 | 0 | 0 | 0 | 0 | 0 | 0 | 0 | 0 |
| | | | D2 | 0 | 0 | 0 | 0 | 0 | 0 | 0 | 0 |
| | water-soluble polyamide resin | | E | 0 | 0 | 0 | 0 | 10 | 20 | 0 | 0 |
| Performance evaluation results of side surface light-blocking layer | light-blocking property (optical density) | | | ∞ (3.1) | ○ (2.3) | ∞ (3.6) | ∞ (4.2) | ∞ (2.7) | ○ (2.1) | ∞ (2.9) | ∞ (2.7) |
| | water developability | | | ○ | ○ | ○ | ○ | ∞ | ∞ | ∞ | ∞ |
| | alcohol solubility | | | ○ | ○ | ○ | ○ | ○ | ○ | ○ | ○ |
| | adhesion to metal support | | | ○ | ○ | ○ | ○ | ○ | ○ | ○ | ○ |

| | | | | Example 9 | Example 10 | Comparative Example 1 | Comparative Example 2 | Comparative Example 3 | Comparative Example 4 | Comparative Example 5 |
|---|---|---|---|---|---|---|---|---|---|---|
| Composition of side surface light-blocking layer (mass %) | carbon black | | A | 50 | 50 | 50 | 50 | 50 | 20 | 85 |
| | hydroxyl group-containing vinyl polymer | butyral resin | B1 | 0 | 0 | 0 | 0 | 0 | 80 | 15 |
| | | | B2 | 0 | 0 | 0 | 0 | 0 | 0 | 0 |
| | | | B3 | 0 | 0 | 0 | 0 | 0 | 0 | 0 |
| | | | B4 | 0 | 0 | 0 | 0 | 50 | 0 | 0 |
| | | partially saponified vinyl acetate | C1 | 50 | 0 | 0 | 0 | 0 | 0 | 0 |
| | | | C2 | 0 | 50 | 0 | 0 | 0 | 0 | 0 |
| | | polyvinyl alcohol | D1 | 0 | 0 | 50 | 0 | 0 | 0 | 0 |
| | | | D2 | 0 | 0 | 0 | 50 | 0 | 0 | 0 |
| | water-soluble polyamide resin | | E | 0 | 0 | 0 | 0 | 0 | 0 | 0 |
| Performance evaluation results of side surface light-blocking layer | light-blocking property (optical density) | | | ∞ (2.8) | ∞ (2.5) | ∞ (2.7) | ∞ (2.5) | ∞ (2.5) | X (1.1) | ∞ (4.4) |
| | water developability | | | ∞ | ∞ | ∞ | ∞ | X | ○ | Δ |
| | alcohol solubility | | | ○ | ○ | X | X | ○ | ○ | ○ |
| | adhesion to metal support | | | ○ | ○ | X | X | ○ | ○ | X |

As is apparent from Table 1, all of Examples 1 to 10, which satisfy the requirements of the present invention, show good results with respect to the light-blocking property of the peripheral side surface of the printing original plate, water developability, alcohol solubility, and adhesion to the metal support. On the other hand, Comparative Examples 1 to 5, which does not satisfy the requirements of the present invention, show poor results in any of the performance evaluations. That is, Comparative Examples 1 and 2, which use polyvinyl alcohol having a too high hydroxyl group concentration, are inferior in alcohol solubility and adhesion to the metal support. Comparative Example 3, which uses a polyvinyl butyral resin having a too low hydroxyl group concentration, is inferior in water developability. Comparative Example 4, in which the content of carbon black is low and the content of the hydroxyl group-containing vinyl polymer is high, is inferior in light-blocking property. Comparative Example 5, in which the content of carbon black is high and the content of the hydroxyl group-containing vinyl polymer is low, is inferior in water developability and adhesion to the metal support.

INDUSTRIAL APPLICABILITY

In the water-developable photosensitive resin printing original plate of the present invention, an alcohol-soluble vinyl polymer containing a hydroxyl group at a specific concentration in the molecule is used as a dispersion binder for carbon black which is a light-blocking component in the side surface light-blocking layer. As a result, peeling of the side surface light-blocking layer from the support including a metal support can be effectively prevented. In addition, the time required for producing the side surface light-blocking layer can be greatly shortened. Therefore, the printing original plate of the present invention is very useful especially in view of the production.

The invention claimed is:

1. A water-developable photosensitive resin printing original plate, comprising at least: a support; and a photosensitive resin layer arranged on the support, in which a peripheral side surface of the water-developable photosensitive resin printing original plate is covered with a light-blocking layer; the light-blocking layer contains carbon black and a vinyl polymer at a mass ratio of 80/20 to 30/70; and the vinyl polymer is an alcohol-soluble vinyl polymer containing 25 to 65 mol % of a hydroxyl group with respect to a constituent monomer unit in a molecule (in the case of being chemically modified, a constituent monomer unit after the modification).

2. The water-developable photosensitive resin printing original plate according to claim 1, in which the vinyl polymer is a polyvinyl acetal resin.

3. The water-developable photosensitive resin printing original plate according to claim 1, in which the vinyl polymer is a partially saponified vinyl acetate resin having a saponification ratio of 25 to 65 mol %.

4. The water-developable photosensitive resin printing original plate according to claim 1, in which the light-blocking layer further contains a water-soluble or water-dispersible polyamide resin in an amount of 5 to 40 mass %.

5. The water-developable photosensitive resin printing original plate according to claim 4, in which the water-soluble or water-dispersible polyamide resin is selected from the group consisting of a tertiary nitrogen atom-containing polyamide, an ammonium salt type tertiary nitrogen atom-containing polyamide, an ether group-containing polyamide, and a sulfonic group-containing polyamide.

6. The water-developable photosensitive resin printing original plate according to claim 1, in which the support is a metal support.

7. The water-developable photosensitive resin printing original plate according to claim 1, in which the water-developable photosensitive resin printing original plate is a CTP relief printing original plate or a CTP flexographic printing original plate.

8. A method for producing a printing plate, comprising the steps of:

imagewise exposing the water-developable photosensitive resin printing original plate according to claim 1; and developing the water-developable photosensitive resin printing original plate after the exposure with an aqueous developer, in which in the step of developing the water-developable photosensitive resin printing original plate after the exposure with the aqueous developer, an uncured portion of the photosensitive layer of the water-developable photosensitive resin printing original plate and the light-blocking layer on a peripheral side surface of the water-developable photosensitive resin printing original plate are each washed away with the aqueous developer and removed from the water-developable photosensitive resin printing original plate.

* * * * *